(12) United States Patent
Kang

(10) Patent No.: US 9,324,574 B2
(45) Date of Patent: Apr. 26, 2016

(54) METHODS OF FORMING PATTERNS IN SEMICONDUCTOR DEVICES

(71) Applicant: Samsung Electronics Co., Ltd., Suwon-si (KR)

(72) Inventor: Yun Seung Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/578,723

(22) Filed: Dec. 22, 2014

(65) Prior Publication Data

US 2015/0255304 A1    Sep. 10, 2015

(30) Foreign Application Priority Data

Mar. 5, 2014    (KR) .................. 10-2014-0026249

(51) Int. Cl.
| | |
|---|---|
| *H01L 21/311* | (2006.01) |
| *H01L 21/469* | (2006.01) |
| *H01L 21/033* | (2006.01) |
| *H01L 21/3213* | (2006.01) |

(52) U.S. Cl.
CPC ...... *H01L 21/31144* (2013.01); *H01L 21/0337* (2013.01); *H01L 21/32139* (2013.01)

(58) Field of Classification Search
CPC ............ H01L 21/31144; H01L 21/311; H01L 21/0337; H01L 21/32139
USPC ................. 438/586, 622, 689, 694, 696, 775; 257/618, 623, 773, 797, E21.19, 257/E21.249, E21.257, E21.582, E21.595, 257/E23.117, E23.142, E23.179, E29.005, 257/E29.022
See application file for complete search history.

(56) References Cited

U.S. PATENT DOCUMENTS

| | | | | |
|---|---|---|---|---|
| 8,143,156 | B2 * | 3/2012 | Matamis ............... | H01L 27/115 438/622 |
| 8,288,293 | B2 * | 10/2012 | Pham .................. | H01L 21/2815 438/775 |
| 8,309,462 | B1 | 11/2012 | Yoshida et al. | |
| 2008/0122125 | A1 | 5/2008 | Zhou | |
| 2008/0248622 | A1 * | 10/2008 | Matamis ............... | H01L 27/105 438/261 |
| 2009/0311861 | A1 * | 12/2009 | Park .................... | H01L 21/0337 438/689 |
| 2010/0155959 | A1 * | 6/2010 | Park .................... | H01L 21/0337 257/773 |
| 2010/0167548 | A1 | 7/2010 | Kim | |
| 2010/0323171 | A1 | 12/2010 | Doytcheva et al. | |
| 2011/0183505 | A1 * | 7/2011 | Min .................... | H01L 21/0337 438/586 |
| 2011/0273685 | A1 | 11/2011 | Li et al. | |

(Continued)

FOREIGN PATENT DOCUMENTS

| | | |
|---|---|---|
| JP | 2009-064951 | 3/2009 |
| JP | 2010278434 | 12/2010 |

(Continued)

*Primary Examiner* — Dao H Nguyen
(74) *Attorney, Agent, or Firm* — Myers Bigel & Sibley, P.A.

(57) ABSTRACT

Methods of forming a pattern in a semiconductor device may be provided. The methods may include sequentially forming a first hard mask layer and a second hard mask layer on an etching target layer including first and second regions, forming a first spacer layer on the second hard mask layer, forming a second hard mask pattern layer by etching the second hard mask layer using the first spacer layer, forming a second spacer layer on a sidewall of the second hard mask pattern layer, forming a first hard mask pattern layer by etching the first hard mask layer using the second spacer layer, and etching the etching target layer using the first hard mask pattern layer.

16 Claims, 13 Drawing Sheets

(56) References Cited

U.S. PATENT DOCUMENTS

| | | |
|---|---|---|
| 2012/0085733 A1 | 4/2012 | Mebarki et al. |
| 2012/0128935 A1 | 5/2012 | Dunn et al. |
| 2013/0048603 A1 | 2/2013 | Kim et al. |
| 2014/0017894 A1* | 1/2014 | Tsai .................... H01L 21/0337 438/694 |
| 2014/0154885 A1* | 6/2014 | Sim .................... H01L 21/0337 438/696 |

FOREIGN PATENT DOCUMENTS

| | | |
|---|---|---|
| JP | 2011238919 | 11/2011 |
| JP | 2012-248647 | 12/2012 |
| KR | 1020090044584 | 5/2009 |
| KR | 1020090105020 | 10/2009 |
| KR | 1020100042941 | 4/2010 |
| KR | 20100079981 | 7/2010 |
| KR | 1020130021658 | 3/2013 |

* cited by examiner

OL

METHODS OF FORMING PATTERNS IN SEMICONDUCTOR DEVICES

CROSS-REFERENCE TO RELATED APPLICATION

This U.S. non-provisional application claims priority under 35 U.S.C. §119 to Korean Patent Application No. 10-2014-0026249, filed on Mar. 5, 2014, in the Korean Intellectual Property Office, the disclosure of which is hereby incorporated by reference in its entirety.

BACKGROUND

The present disclosure generally relates to the field of electronics and, more particularly, to semiconductor devices.

In accordance with an increase in the integration of semiconductor devices, a design rule of constituent elements configuring a semiconductor device has decreased. In manufacturing semiconductor devices having fine patterns to correspond to the trend toward high integration of semiconductor devices, patterns having fine dimensions to overcome limitations in resolution through a photolithography process may be formed. Accordingly, methods of forming fine patterns have been developed.

SUMMARY

Some embodiments of the present inventive concept may provide a method of forming a pattern in a semiconductor device in which various patterns having different pattern density or pattern sizes may be formed.

According to some embodiments of the present inventive concept, a method of forming a pattern of a semiconductor device may include stacking a first hard mask layer and a second hard mask layer on an etching target layer having first and second regions, forming a first spacer layer on the second hard mask layer, forming a second hard mask pattern layer by etching the second hard mask layer using the first spacer layer, forming a second spacer layer on a sidewall of the second hard mask pattern layer, forming a first hard mask pattern layer by etching the first hard mask layer using the second spacer layer, and etching the etching target layer using the first hard mask pattern layer.

In the second region, at least a portion of a sacrificial pattern layer may remain between the first spacer layers while in the first region the sacrificial pattern layer is removed between the first spacer layers.

In the etching of the etching target layer, a line pattern having a first width may be formed in the first region, and a pattern having a second width larger than the first width is formed in the second region.

The method may further include forming a third hard mask layer including a first layer and a second layer sequentially stacked on the second hard mask layer.

The forming of the second hard mask pattern layer may include forming a third hard mask pattern layer including a first pattern layer and a second pattern layer by etching the third hard mask layer using the first spacer layer, and etching the second hard mask layer using at least a portion of the third hard mask pattern layer. The third hard mask pattern layer remaining on the second hard mask pattern layer may have different thicknesses in the first and second regions.

A difference in thicknesses of the third hard mask pattern layer remaining in the first and second regions may be substantially the same as or less than a thickness of the second layer.

The method may further include removing the second pattern layer from the first region after the forming of the third hard mask pattern layer.

The second pattern layer in the second region may be covered with the sacrificial pattern layer, not to be removed from the second region.

The second pattern layer may be selectively removed by an etchant having etch selectivity with respect to the first pattern layer.

The removing of the second pattern layer from the first region may be performed after the forming of the second hard mask pattern layer.

The forming of the first spacer layer may include forming a sacrificial layer on the second hard mask layer, forming the sacrificial pattern layer by patterning the sacrificial layer, forming a first preparatory spacer layer on the sacrificial pattern layer, etching the first preparatory spacer layer to form the first spacer layer on a sidewall of the sacrificial pattern layer, and removing the sacrificial pattern layer from the first region.

In the etching of the etching target layer, a pattern formed in the second region may be located in a region of the second region corresponding to a position of the sacrificial pattern layer and may have a size larger than that of the sacrificial pattern layer.

The removing of the sacrificial pattern layer from the first region may include forming a photoresist layer in the second region.

The first region may be a cell region, and the second region may include at least one of a peripheral circuit region and a scribe lane region.

The second region may be an overlay key region, and the overlay key region may include a trench key.

According to some embodiments of the present inventive concept, a method of forming a pattern of a semiconductor device may include forming a first mask pattern layer on an etching target layer having first and second regions using a first double patterning technology process (DPT), forming a second mask pattern layer by performing a second DPT process using the first mask pattern layer, and etching the etching target layer using the second mask pattern layer. In the first and second DPT processes, the second region may not be double patterned.

The first region may be a cell region, and the second region may comprise at least one of a peripheral circuit region and a scribe lane region.

The second region may be an overlay key region, and the overlay key region may comprise a trench key.

According to some embodiments of the present inventive concept, a method of forming a pattern of a semiconductor device may include stacking a first hard mask layer, a second hard mask layer and a third hard mask layer on an etching target layer having first and second regions, forming a sacrificial pattern layer on the third hard mask layer, forming a first spacer layer on a sidewall of the sacrificial pattern layer, removing the sacrificial pattern layer from the first region, forming a third hard mask pattern layer by etching the third hard mask layer using the first spacer layer, forming a second hard mask pattern layer by etching the second hard mask layer using the third hard mask pattern layer, forming a second spacer layer on a sidewall of the second hard mask pattern layer, forming a first hard mask pattern layer by etching the first hard mask layer using the second spacer layer, and etching the etching target layer using the first hard mask pattern layer.

The method may further include forming a cover pattern layer on the sacrificial pattern layer, and removing the cover pattern layer from the first region.

DETAILED DESCRIPTION

Figure 1:
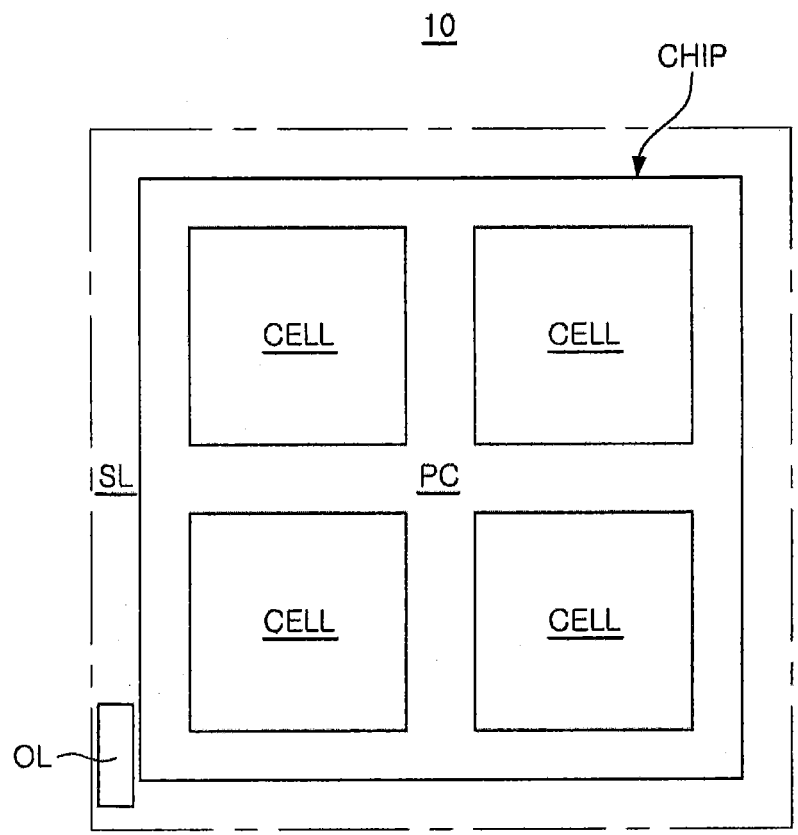
FIG. 1 is a diagram of a semiconductor wafer on which a semiconductor device is formed according to some embodiments of the present inventive concept.

Some embodiments of the present inventive concept will now be described with reference to the accompanying drawings. Many different forms and embodiments are possible without deviating from the spirit and teachings of this disclosure and so the disclosure should not be construed as limited to the example embodiments set forth herein. Rather, these embodiments are provided so that this disclosure will be thorough and complete and will fully convey the scope of the disclosure to those skilled in the art. In the drawings, the sizes and relative sizes of regions may be exaggerated for clarity.

It will be understood that when an element or layer is referred to as being "on," "connected to," or "coupled with" another element or layer, it can be directly on, connected to or coupled with the other element or layer or intervening elements or layers may be present. In contrast, when an element is referred to as being "directly on," "directly connected to," or "directly coupled with" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, and/or sections, these elements, components, regions, and/or sections should not be limited by these terms. These terms are only used to distinguish one element, component, region, or section from another element, component, region, or section. Thus, a first element, component, region, or section could be termed a second element, component, region, or section without departing from the teachings of the disclosure.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprise" and "include," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a diagram of a semiconductor wafer on which a semiconductor device is formed according to some embodiments of the present inventive concept.

With reference to FIG. 1, a semiconductor wafer 10 may include a semiconductor chip region CHIP, and a scribe lane region SL between respective semiconductor chips CHIP. In some embodiments, the semiconductor chip region CHIP may include cell regions CELL and a peripheral circuit region PC. For example, one or more cell regions CELL and a peripheral circuit region PC may form a single semiconductor chip region CHIP, and the scribe lane region SL may be disposed to surround the semiconductor chip regions CHIP.

In the cell regions CELL, a semiconductor memory cell array, for example, a volatile memory cell array such as a DRAM, or a non-volatile memory cell array such as a flash memory, may be formed. In the peripheral circuit region PC, peripheral circuits electrically connected to the cell arrays formed in the cell regions CELL may be formed.

FIG. 1 illustrates that the peripheral circuit region PC surrounds the cell regions CELL, but the present inventive concept is not limited thereto, and the cell regions CELL and the peripheral region PC may have various layouts. According to some embodiments of the present inventive concept, a portion of the peripheral circuit region PC may also be disposed within the cell region CELL. The number of cell regions CELL forming a single semiconductor chip region CHIP is not limited to that illustrated in FIG. 1.

The scribe lane region SL may correspond to a region in which a dicing process of a semiconductor wafer 10 is performed in which the semiconductor wafer 10 is divided into respective semiconductor chips after forming semiconductor devices in a semiconductor chip region CHIP. In some embodiments, the scribe lane region SL may include a key region OL as illustrated in FIG. 1. The key region OL may include overlay keys or alignment keys used in an exposure process performed to form a semiconductor device in the semiconductor chip region CHIP. A position of the key region OL is not limited to the illustration of the drawings, and may be disposed inside the semiconductor chip region CHIP according to some embodiments of the present inventive concept.

Figure 2:
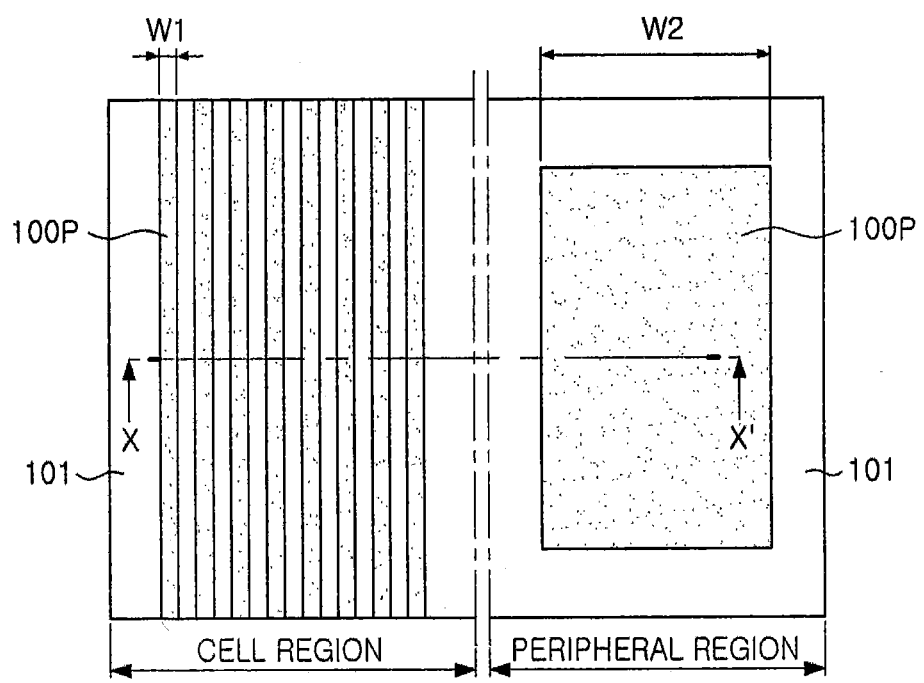
FIG. 2 is a plan view illustrating a semiconductor device formed using a method device according to some embodiments of the present inventive concept.

FIG. 2 is a plan view illustrating a semiconductor device formed using a method device according to some embodiments of the present inventive concept.

With reference to FIG. 2, a semiconductor device may include a first region, a cell region, and a second region, a peripheral region. The cell region may include cell regions CELL described above with reference to FIG. 1. The peripheral region may include the peripheral circuit region PC or the scribe lane region SL described above with reference to FIG. 1.

Patterns 100P may be formed on respective substrates 101 in the cell region and the peripheral region. The patterns 100P in the cell region and the peripheral region may have different sizes. For example, as illustrated in FIG. 2, the pattern 100P of the cell region may be formed as line patterns having a first width W1 and repetitively formed to have a fine pitch. According to some embodiments of the present inventive concept, the first width W1 may correspond to a minimum feature size of a semiconductor device. In some embodiments, the pattern 100P in the peripheral region may be formed as a pattern having a second width W2 greater than the first width W1 in the same direction. For example, the first width W1 may have a size within a range of several nanometers to tens of nanometers, and the second width W2 may be within a range of hundreds of nanometers to tens of micrometers. For example, the second width W2 may have a size tens of times to thousands of times greater than the first width W1.

The pattern 100P of the cell region may constitute, for example, an active region or a conductive line of the cell array region of the semiconductor device. The conductive line may be, for example, a word line or a bit line. The pattern 100P of the peripheral region may constitute an active region or a gate region of a transistor or an overlay key.

Sizes and layouts of the patterns 100P in the cell region and the peripheral region may be changed depending on a semiconductor device type and a necessary pattern type.

FIGS. 3A through 3M are cross-sectional views illustrating a method of forming a pattern in a semiconductor device according to some embodiments of the present inventive concept. FIGS. 3A through 3M illustrate cross-sectional views taken along the line X-X' of FIG. 2.

Figure 3A:
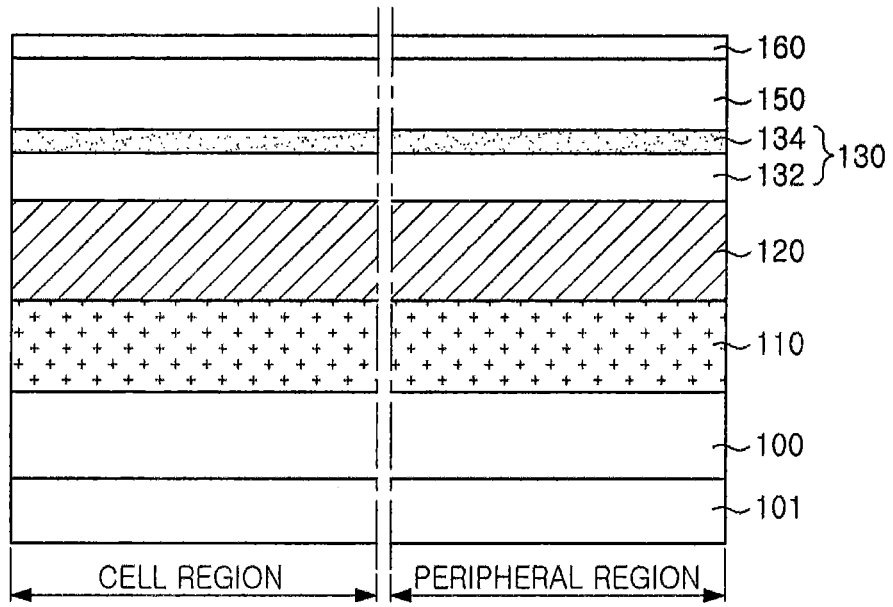
FIGS. 3A through 3M are cross-sectional views illustrating a method of forming a pattern in a semiconductor device according to some embodiments of the present inventive concept.

With reference to FIG. 3A, a first hard mask layer 110, a second hard mask layer 120, a third hard mask layer 130 and sacrificial layers 150 and 160 may be sequentially formed on the substrate 101 on which an etching target layer 100 may be formed. The plurality of layers stacked on the etching target layer 100 may be used as masks by which patterns are formed on the etching target layer 100, or may be layers for the formation of masks.

The substrate 101 may be a semiconductor substrate such as a silicon wafer. In some embodiments, the substrate 101 may also be a substrate provided by forming a portion of semiconductor devices on the silicon wafer. The etching target layer 100 may be a conductive layer or an insulating layer formed on the substrate 101, and may correspond to a portion of the substrate 101 according to some embodiments of the present inventive concept.

The first through third hard mask layers 110, 120 and 130 may be formed using various layer materials depending on a material of the etching target layer 100. The respective first to third hard mask layers 110, 120 and 130 may be formed using a material having etch selectivity different from that of a lower layer being in direct contact therewith, so as to be used as masks for the respective lower etching target layer 100 and first and second hard mask layers 110 and 120. Such etch selectivity or an etch selection ratio may be quantitatively represented by a ratio of an etching speed of another layer to an etching speed of a layer in a specific etching condition. For example, the first to third hard mask layers 110, 120 and 130 may contain a silicon-containing material such as silicon oxide ($SiO_2$), silicon oxynitride (SiON), silicon nitride ($Si_3N_4$), polysilicon or the like, a carbon-containing material containing a hydrocarbon compound or derivatives thereof, such as an amorphous carbon layer (ACL) or Spin-On Hardmask (SOH), and at least one of a metal or an organic material, respectively. For example, the first hard mask layer 110 may comprise polysilicon, the second hard mask layer 120 may comprise a carbon-containing material, and the third hard mask layer 130 may comprise at least one of silicon oxide ($SiO_2$) and silicon oxynitride (SiON).

In some embodiments, the third hard mask layer 130 may include first and second layers 132 and 134. The third hard mask layer 130 may comprise a dual layer for the formation of a step between a cell region and a peripheral region in a subsequent process. The second layer 134 may have a thickness less than that of the first layer 132, but not limited thereto. The first and second layers 132 and 134 may be formed using materials having an etch selectivity with respect to each other. For example, the first layer 132 may comprise silicon oxynitride (SiON), and the second layer 134 may comprise silicon oxide ($SiO_2$).

The first to third hard mask layers 110, 120 and 130 may be formed using a process such as Atomic Layer Deposition (ALD), Chemical Vapor Deposition (CVD), spin coating, or the like. According to a material used therein, a baking process or a curing process may be additionally performed.

In some embodiments, one or more buffer layers may be formed between the first hard mask layer 110 and the etching target layer 100. When a level of an etch selectivity between the first hard mask layer 110 and the etching target layer 100 is relatively low, the buffer layer may be formed using a material having a relatively high level of an etch selectivity with respect to the etching target layer 100, to be used as a mask. For example, when the etching target layer 100 comprises silicon and the first hard mask layer 110 comprises polysilicon, a buffer layer of an insulating material may be further formed therebetween.

The first and second sacrificial layers 150 and 160 may be provided for the formation of a first spacer layer (e.g., 172S of FIG. 3D) in a subsequent process. The second sacrificial layer 160 may have a thickness less than that of the first sacrificial layer 150, but not limited thereto. The first and second sacrificial layers 150 and 160 may be formed using materials having different etch selectivity. For example, the first sacrificial layer 150 may comprise a carbon-containing material, and the second sacrificial layer 160 may comprise silicon oxynitride (SiON).

A reflection protective layer may be further formed on the second sacrificial layer 160, and the reflection protective layer may serve as preventing reflection at the time of performing a subsequent photolithography process. The reflection protective layer may contain an organic material or an inorganic material. According to some embodiments of the present inventive concept, the second sacrificial layer 160 may function as a reflection protective layer.

Within the scope of the present inventive concept, the materials of the first to third hard mask layers 110, 120 and 130 and the first and second sacrificial layers 150 and 160 are not limited to the illustration according to the foregoing embodiment of the present inventive concept, and materials having different etch selectivity under a predetermined etching condition may be selectively used for adjacent layers among the respective layers.

Figure 3B:
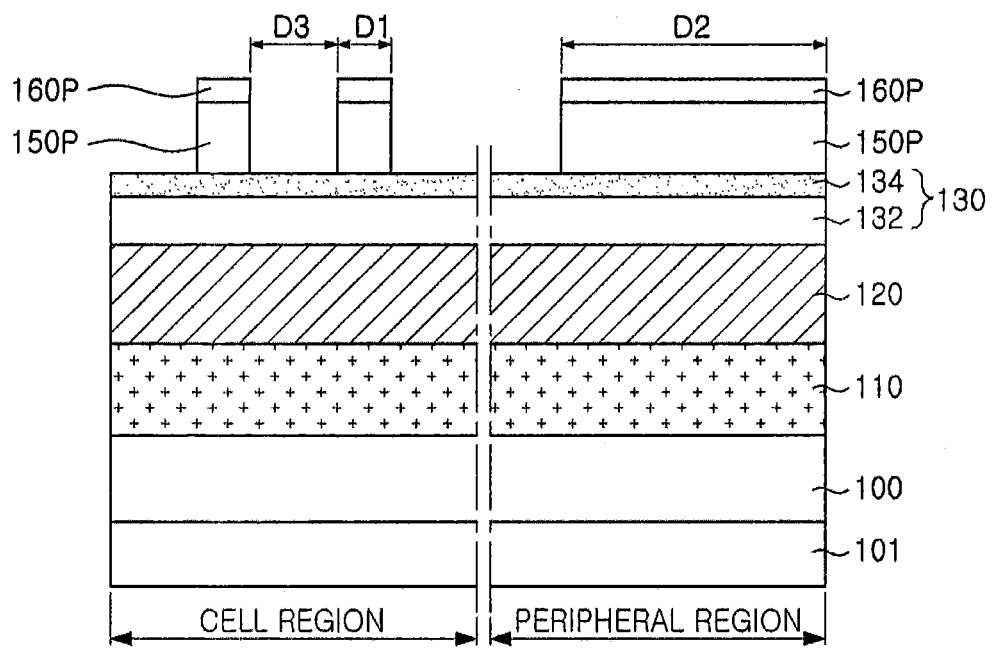

With reference to FIG. 3B, first and second sacrificial pattern layers 150P and 160P may be formed by removing portions of the first and second sacrificial layers 150 and 160.

A photoresist layer may be formed, and the photoresist layer may be patterned through a photolithography process. Then, the first and second sacrificial layers 150 and 160 may be subjected to an etching process using the patterned photoresist layer. The etching process may be performed using, for example, a dry etching or reactive ion etching method (RIE).

The first and second sacrificial pattern layers 150P and 160P may be formed to have a first dimension D1 in the cell region and to have a second dimension D2 greater than the first dimension D1 in the peripheral region. In the cell region, a space between adjacent first and second sacrificial pattern layers 150P and 160P may have a third dimension D3 greater than the first dimension D1. For example, when a line width of the patterns 100P in the cell region is defined as a first line width W1 as shown in FIG. 2, the first dimension D1 may be about three times the first line width W1, and the second dimension D2 may be about five times the first line width W1. However, the first and second dimensions D1 and D2 may be determined in consideration of thicknesses of the first to third hard mask layers 110, 120 and 130 and the first and second spacer layers (e.g., 172S of FIG. 3D and 174S of FIG. 3J) formed in a subsequent process as well as the size of the patterns 100P.

Figure 3C:
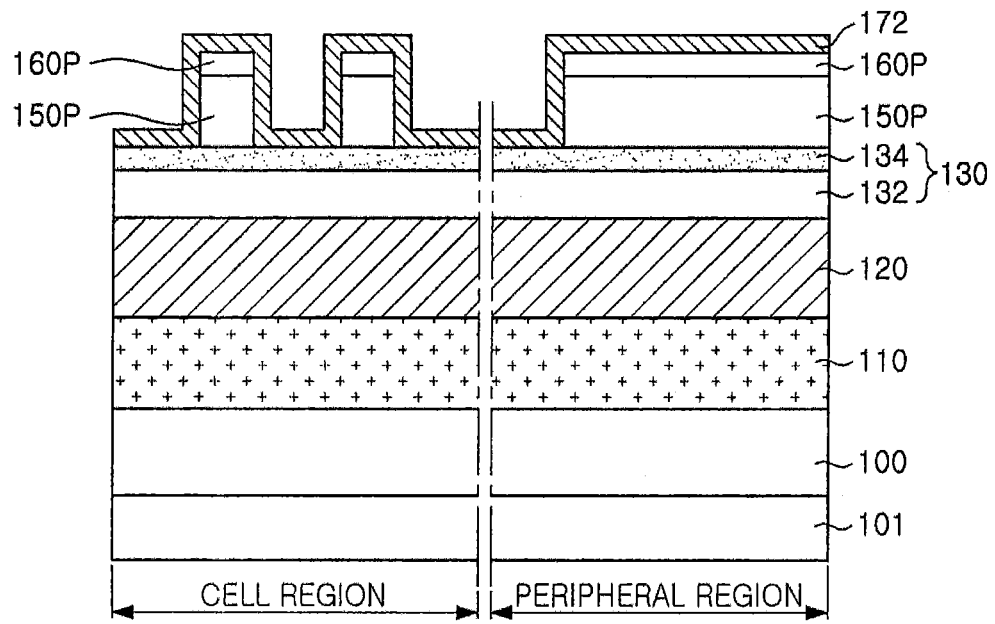

Referring to FIG. 3C, a first preparatory spacer layer 172 may be formed to cover the first and second sacrificial pattern layers 150P and 160P and an exposed upper surface of the third hard mask layer 130.

The first preparatory spacer layer 172 may comprise a material having an etch selectivity with respect to the first and second sacrificial pattern layers 150P and 160P. According to some embodiments of the present inventive concept, the first preparatory spacer layer 172 may be formed using the same material as that of at least a portion of the third hard mask layer 130, for example, the first preparatory spacer layer 172 and the second layer 134 of the third hard mask layer 130 may comprise an oxide layer, and the first layer 132 may comprise an oxynitride layer.

Figure 3D:
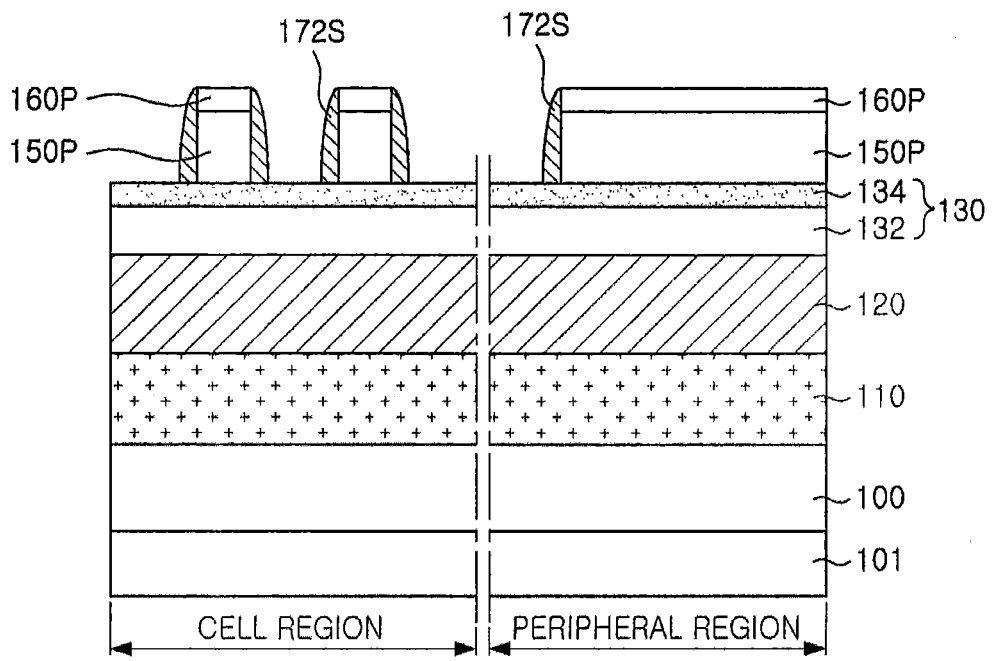

With reference to FIG. 3D, the first spacer layer 172S may be formed on sidewalls of the first and second sacrificial pattern layers 150P and 160P by etching the first preparatory spacer layer 172.

The first preparatory spacer layer 172 may be etched until the second sacrificial pattern layer 160P and the third hard mask layer 130 between the first and second sacrificial pattern layers 150P and 160P are exposed to form the first spacer layer 172S.

The first spacer layer 172S may be used as an etching mask for multiplying a pattern density in a subsequent process. Therefore, a thickness of the first spacer layer 172S on one sidewall of the first and second sacrificial pattern layers 150P and 160P may be determined in consideration of the size and pitch of the pattern of the semiconductor device (e.g., 100P of FIG. 2) to be necessary for the formation thereof. For example, when the patterns 100P are patterns on which lines having the first line width W1 are repetitively formed to have a predetermined interval S therebetween, a width of the first spacer layer 172S on an upper surface of the third hard mask layer 130 may be determined to have a width within a range similar to the predetermined interval S.

A portion of the second sacrificial pattern layer 160P may be removed while the first preparatory spacer layer 172 is etched.

Figure 3E:
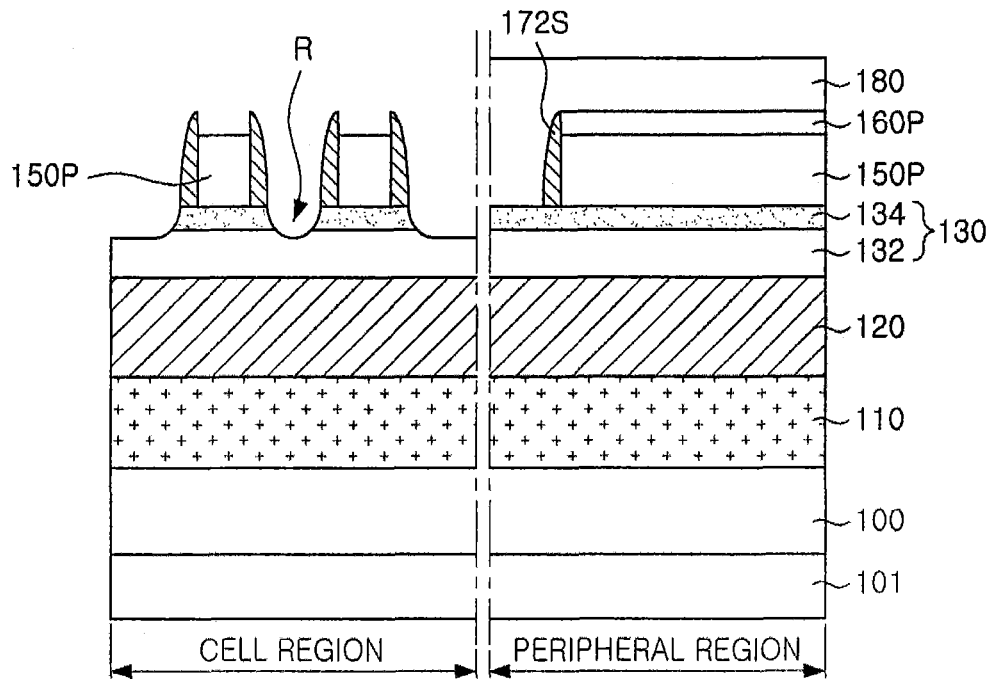

With reference to FIG. 3E, the second sacrificial pattern layer 160P may be removed from the cell region.

A photomask layer 180 may be formed in the peripheral region, such that only the cell region may be exposed, and the second sacrificial pattern layer 160P of the cell region may then be selectively etched. The second sacrificial pattern layer 160P may be selectively etched with respect to the first spacer layer 172S. In this process, the second layer 134, an exposed portion of the third hard mask layer 130, may be removed, to form a recess region R. However, the recess region R may not be formed according to some embodiments of the present inventive concept.

Figure 3F:
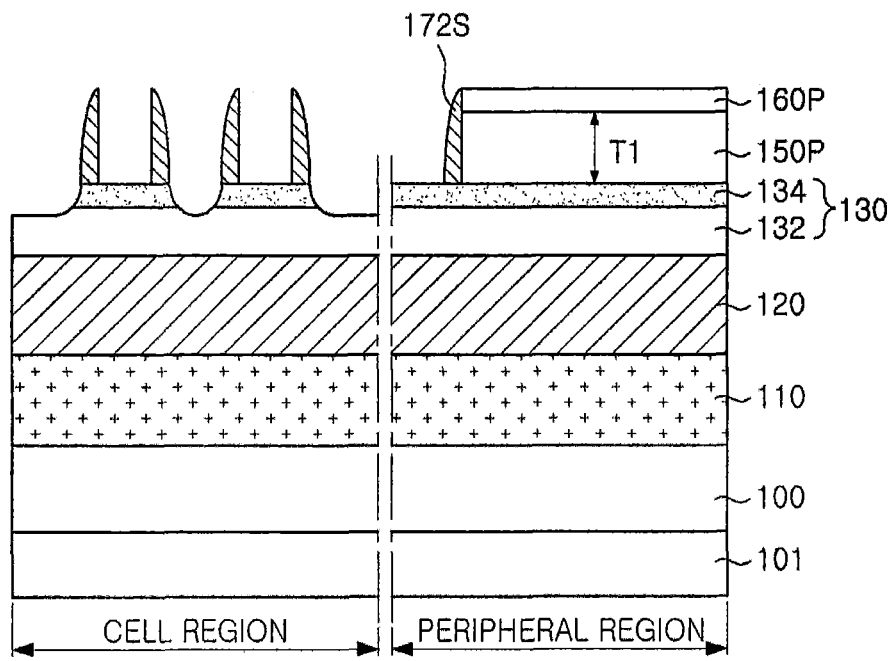

With reference to FIG. 3F, the first sacrificial pattern layer 150P may be removed from the cell region.

In the cell region, the first sacrificial pattern layer 150P may be selectively etched with respect to the first spacer layer 172S. During this process, at least a portion of the second layer 134 below the first sacrificial pattern layer 150P may be removed.

The photoresist layer 180 may be removed before or after the removal of the first sacrificial pattern layer 150P. In the case of the peripheral region, even when the photoresist layer 180 is first removed before the removal of the first sacrificial pattern layer 150P, since the second sacrificial pattern layer 160P remains, the first sacrificial pattern layer 150P may not be removed.

Figure 3G:
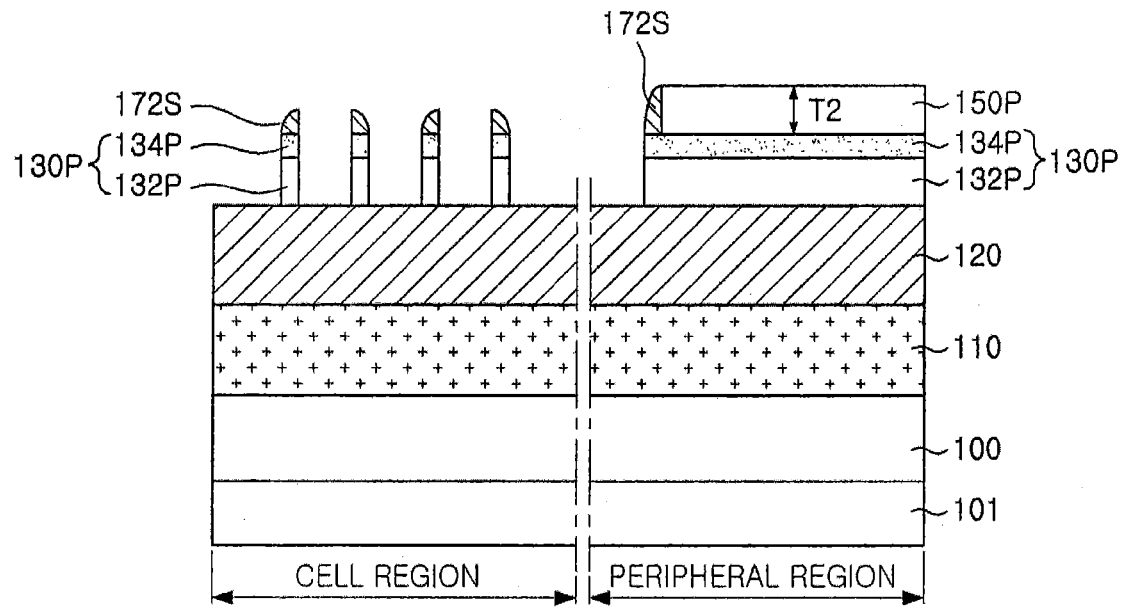

Referring to FIG. 3G, a third hard mask pattern layer 130P may be formed by etching the third hard mask layer 130 using the first spacer layer 172S as mask.

The third hard mask pattern layer 130P may include first and second pattern layers 132P and 134P. Although the first spacer layer 172S remains on the third hard mask pattern layer 130P in FIG. 3G, in some embodiments, the first spacer layer 172S may be completely removed depending on a thickness of the third hard mask pattern layer 130P and the first spacer layer 172S.

For example, when the second sacrificial pattern layer 160P includes the same material as that of at least one of the first and second layers 132 and 134, the second sacrificial pattern layer 160P may be removed from the peripheral region as illustrated in FIG. 3G. In some embodiments, a portion of the first sacrificial pattern layer 150P may be removed to have a second thickness T2 less than that of a first thickness T1 as illustrated in FIG. 3F.

The processes illustrated in FIGS. 3A through 3G correspond to a double patterning technology for forming two third hard mask pattern layers 130P from one first and second sacrificial pattern layer 150P and 160P.

Figure 3H:
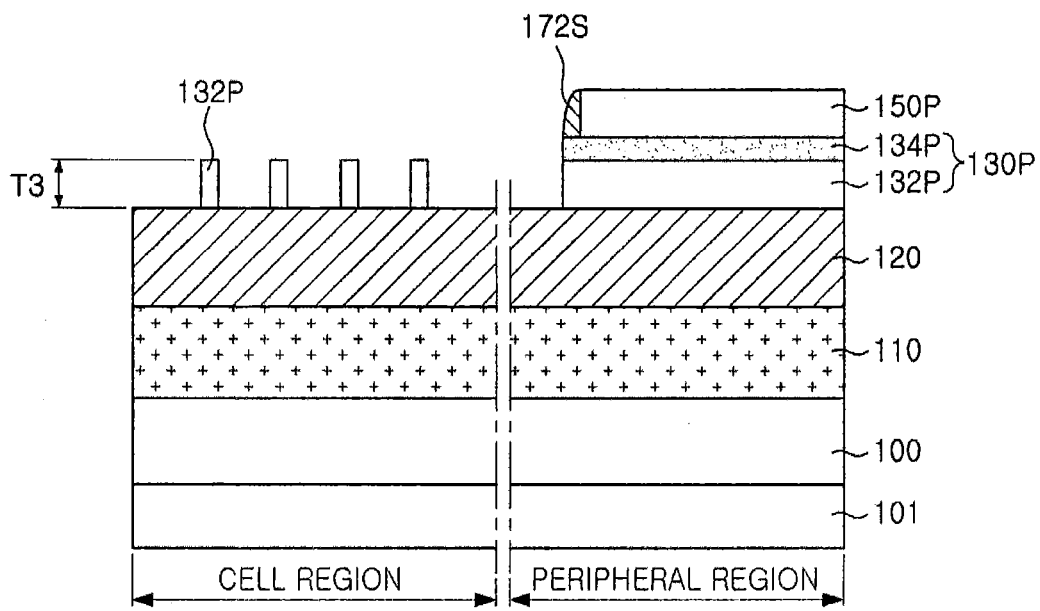

With reference to FIG. 3H, the second pattern layer 134P may be removed from the cell region.

The second pattern layer 134P may be removed from the cell region without forming a separate mask, by using a wet or dry etching process.

In the case of the peripheral region, a portion of the second pattern layer 134P may also be removed from an edge of the third hard mask pattern layer 130P. However, since the size of the second pattern layer 134P of the peripheral region is larger than that in the cell region, and the first sacrificial pattern layer 150P may cover an upper part thereof, the majority of the second pattern layer 134P may remain in the peripheral region while the second pattern layer 134P may be completely removed from the cell region. The first pattern layer 132P in the cell region may have a third thickness T3.

Figure 3I:
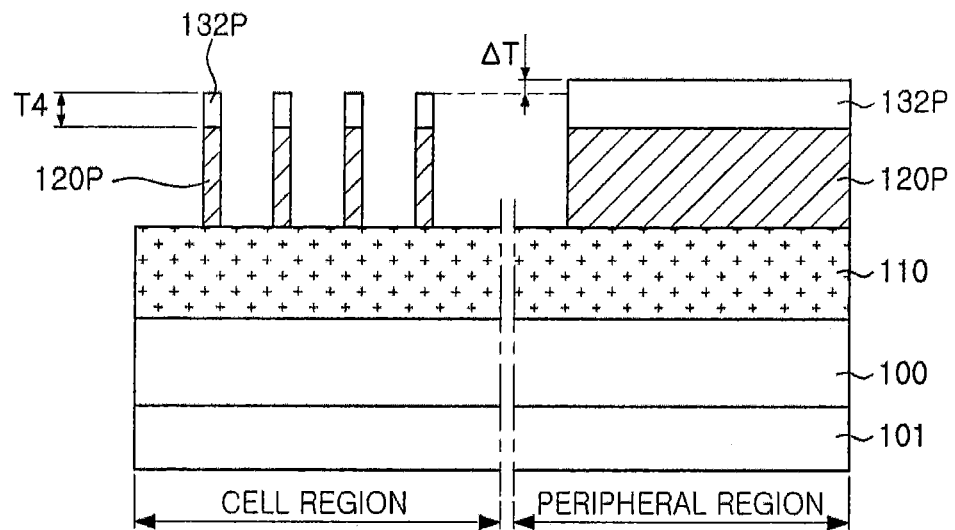

With reference to FIG. 3I, a second hard mask pattern layer 120P may be formed by etching the second hard mask layer 120 using the first pattern layer 132P.

In this process, a portion of the first pattern layer 132P may be removed such that the thickness of the first pattern layer 132P may have a fourth thickness T4 less than the third thickness T3 of FIG. 3H.

For example, when the second hard mask layer 120 and the first sacrificial pattern layer 150P are formed using materials having selective etching properties similar to each other, the first sacrificial pattern layer 150P of the peripheral region may be also removed. Therefore, at least a portion of the second pattern layer 134P in the peripheral region may be removed. As illustrated, even when the entirety of the second pattern layer 134P is removed from the peripheral region, the first pattern layer 132P of the peripheral region may remain and may have a thickness greater than that of the first pattern layer 132P in the cell region. Thus, a step ΔT between the cell region and the peripheral region may be formed due to a difference in the thickness of the first pattern layer 132P in the cell region and the peripheral region. The step ΔT may be substantially the same as or less than a thickness of the second pattern layer 134P or the second layer 134.

Figure 3J:
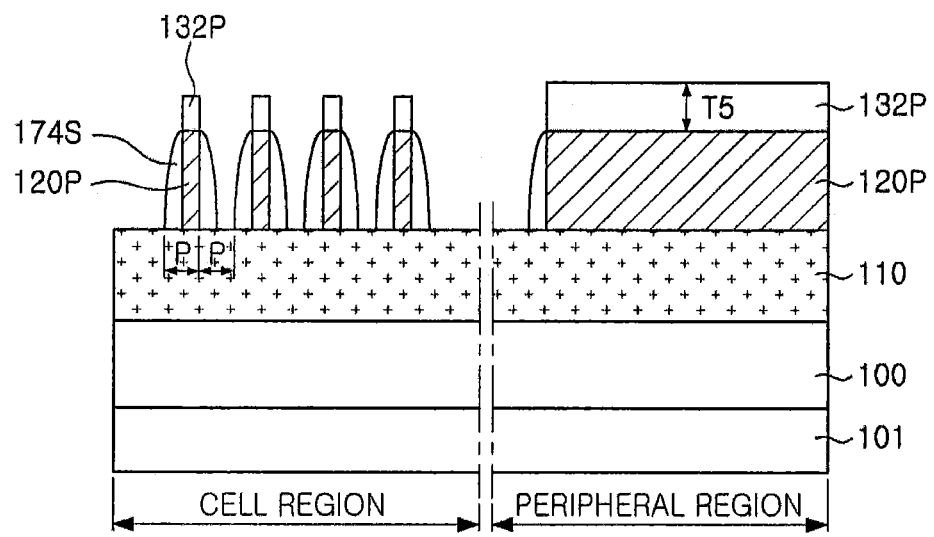

With reference to FIG. 3J, a second spacer layer 174S may be formed on sidewalls of the second hard mask pattern layer 120P.

The second spacer layer 174S may be formed through a process similar to that of the first spacer layer 172S described above with reference to FIGS. 3C and 3D. A thickness of the second spacer layer 174S on an upper surface of the first hard mask layer 110 may be determined to be within a range similar to the first line width W1 of the pattern 100P illustrated in FIG. 2 to be finally formed. In some embodiments, the sum of a thickness of one second spacer layer 174S, and a thickness of the second hard mask pattern layer 120P adjacent thereto or a distance of an exposed region of the first hard mask layer 110 may be substantially the same as a pitch P of the pattern 100P to be formed.

During this process, a portion of the first pattern layer 132P may also be removed. The first pattern layer 132P in the cell region may have a fifth thickness T5.

Figure 3K:
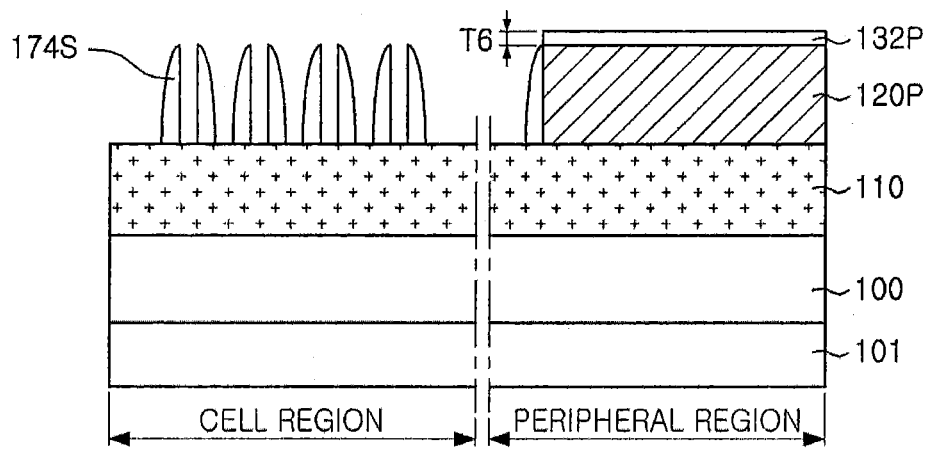

With reference to FIG. 3K, the first pattern layer 132P and the second hard mask pattern layer 120P may be removed from the cell region.

Even when a separate mask is not formed in the peripheral region, due to a difference in the size of the first pattern layer 132P in the cell region and the peripheral region, the first pattern layer 132P of the cell region having a relatively higher level of an exposure ratio at which it is exposed to an etchant may be removed early. In this case, the first pattern layer 132P of the peripheral region may remain. The first pattern layer 132P of the peripheral region may have a sixth thickness T6 less than the fifth thickness T5 of FIG. 3J, and a difference in the thickness of the sixth thickness T6 and the fifth thickness T5 may be similar to or greater than the size of the step ΔT of the first pattern layers 132P in the cell region and the peripheral region described above with reference to FIG. 3I.

Since the first pattern layer 132P may be completely removed from the cell region, the second hard mask pattern layer 120P below the first pattern layer 132P may be exposed and removed.

Figure 3L:
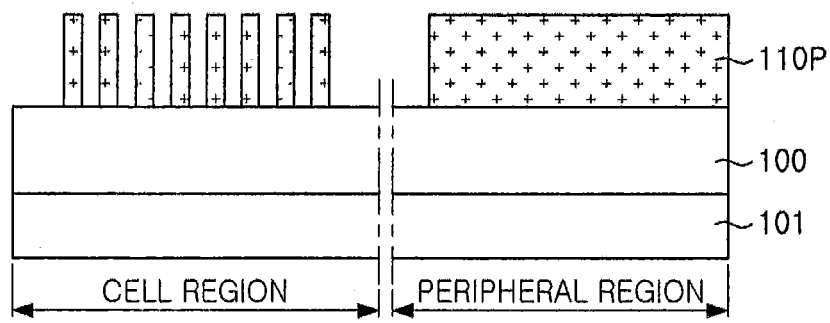

Referring to FIG. 3L, a first hard mask pattern layer 110P may be formed by etching the first hard mask layer 110 using the second spacer layer 174S.

According to some embodiments of the present inventive concept, etching an additional lower mask layer such as a buffer layer using the first hard mask pattern layer 110P may be further performed.

The processes illustrated with reference to FIGS. 3I through 3L may correspond to the DPT process of forming two first hard mask pattern layers 110P from one second hard mask pattern layer 120P.

Figure 3M:
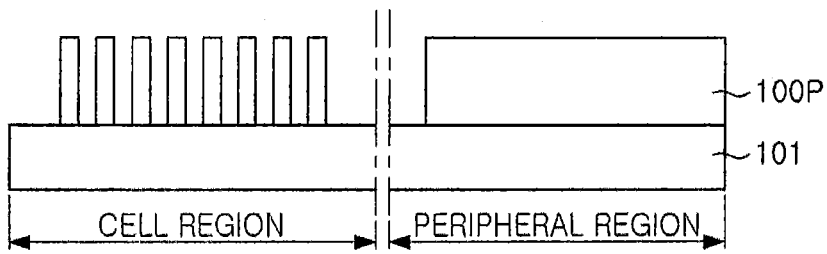

With reference to FIG. 3M, the pattern 100P may be formed by etching the etching target layer 100 using the first hard mask pattern layer 110P.

Thus, a fine pattern may be formed in the cell region and a relatively large pattern may be formed in the peripheral region as illustrated in FIG. 2. The pattern 100P of the peripheral region may be formed in a position corresponding to a position of the first and second sacrificial pattern layers 150P and 160P of FIG. 3B, and may have a larger size than that of the first and second sacrificial pattern layers 150P and 160P. For example, the pattern 100P of the peripheral region may be a pattern in which one side thereof is extended to correspond to the sum of thicknesses of the first and second spacer layers 172S of FIG. 3D and 174S of FIG. 3J from the first and second sacrificial pattern layers 150P and 160P.

According to some embodiments of the present inventive concept, an additional process may be performed for the pattern 100P having the form of a line formed in the cell region to implement various forms of pattern. For example, a plurality of rectangular patterns may be formed by removing a portion of the pattern 100P in a direction perpendicular to a direction in which the patterns 100P are extended in the form of a line.

Methods according to some embodiments of the present inventive concept, the DPT process may be performed twice in the cell region, such that a relatively large pattern may be formed in the peripheral region while a quadruple patterning technology (QPT) process of forming four patterns 100P from one first and second sacrificial pattern layers 150P and 160P may be performed in the cell region. In some embodiments, a step between the cell region and the peripheral region may be formed to form a fine pattern in the cell region and form a necessary size of pattern in the peripheral region through a dual-layer third hard mask layer 130 and a process using the same.

Figure 4A:
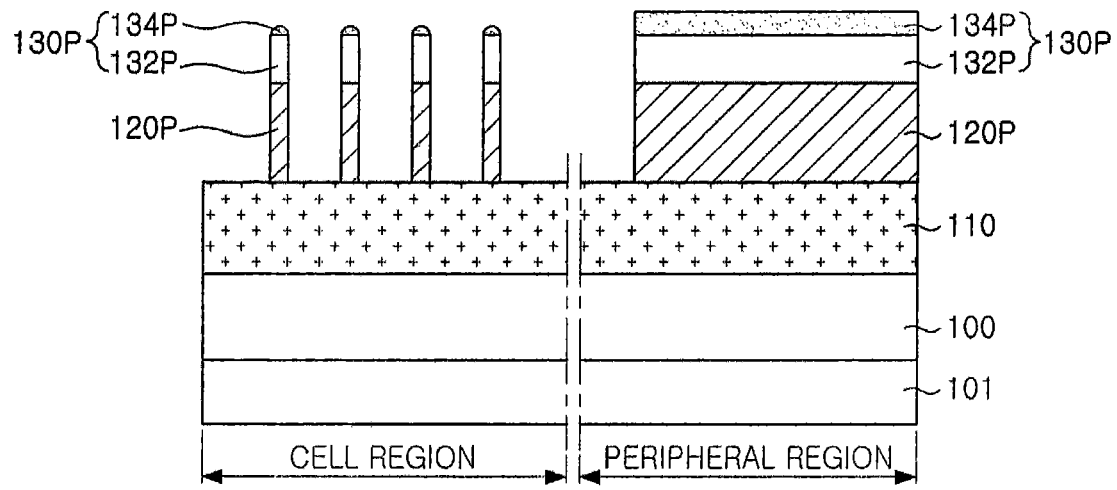
FIGS. 4A and 4B are cross-sectional views illustrating a method of forming a pattern in a semiconductor device according to some embodiments of the present inventive concept.
Figure 4B:
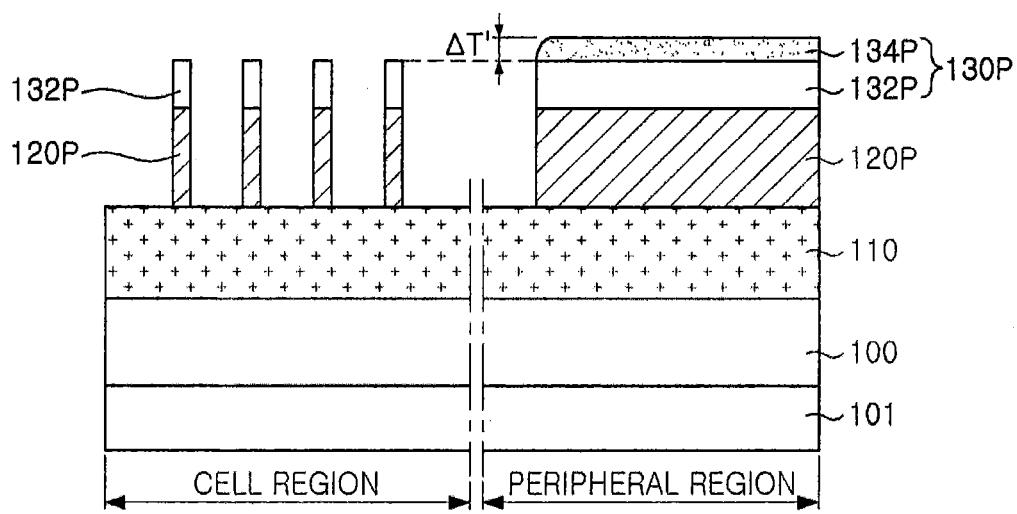

FIGS. 4A and 4B are cross-sectional views illustrating a method of forming a pattern in a semiconductor device according to some embodiments of the present inventive concept. FIGS. 4A and 4B illustrate cross-sectional views taken along the line X-X' of FIG. 2.

With reference to FIG. 4A, a third hard mask pattern layer 130P may be formed by performing the processes described above with reference to FIGS. 3A through 3G. Subsequently, a second hard mask layer 120 may be etched to form a second hard mask pattern layer 120P.

During forming the second hard mask pattern layer 120P, as illustrated, the second pattern layer 134P may be partially removed from an upper part of the second hard mask pattern layer 120P of the cell region such that only a portion the second pattern layer 134P may remain. In the case of the peripheral region, even when the entirety of the first sacrificial pattern layer 150P is removed, a relatively large amount of the second pattern layer 134P may remain as compared to that in the cell region.

Referring to FIG. 4B, the second pattern layer 134P remaining in the cell region may be removed.

Similar to the description above with reference to FIG. 3H, the second pattern layer 134P may be removed from the cell region without forming a separate mask through a wet or dry etching process.

Even when the first sacrificial pattern layer 150P of the peripheral region is removed during forming the second hard mask pattern layer 120, the majority of the second pattern layer 134P of the peripheral region may remain due to a difference in the size of the pattern in the cell region and the peripheral region. Since the second pattern layer 134P of the peripheral region may only be partially removed from an edge portion of the peripheral region, the majority of the second pattern layer 134P may remain, and a step ΔT' having a size corresponding to a thickness of the remaining second pattern layer 134P may be formed between the cell region and the peripheral region.

The pattern 100P may be formed by performing the processes described above with reference to FIGS. 3J through 3M.

Figure 5A:
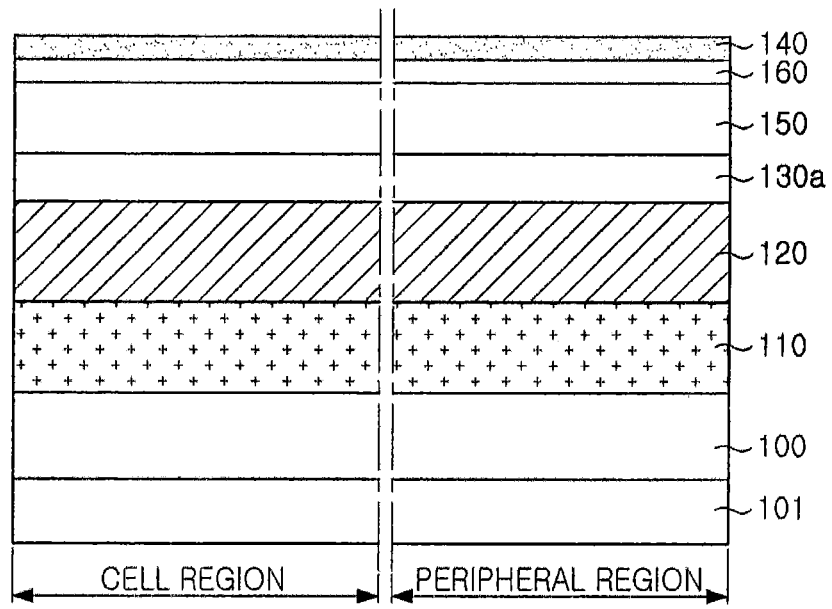
FIGS. 5A through 5F are cross-sectional views illustrating a method of forming a pattern in a semiconductor device according to some embodiments of the present inventive concept.

FIGS. 5A through 5F are cross-sectional views illustrating a method of forming a pattern in a semiconductor device according to some embodiments of the present inventive concept. FIGS. 5A to 5F illustrate cross-sectional views taken along the line X-X' of FIG. 2. With reference to FIG. 5A, a first hard mask layer 110, a second hard mask layer 120, a third hard mask layer 130a, sacrificial layers 150 and 160 and a cover layer 140 may be sequentially formed on a substrate 101 on which an etching target layer 100 may be formed. The plurality of layers stacked on the etching target layer 100 may be used as masks for the formation of patterns on the etching target layer 100 or may be layers for the formation of masks.

The cover layer 140 may be used to form a step between the cell region and the peripheral region in a subsequent process.

Figure 5B:
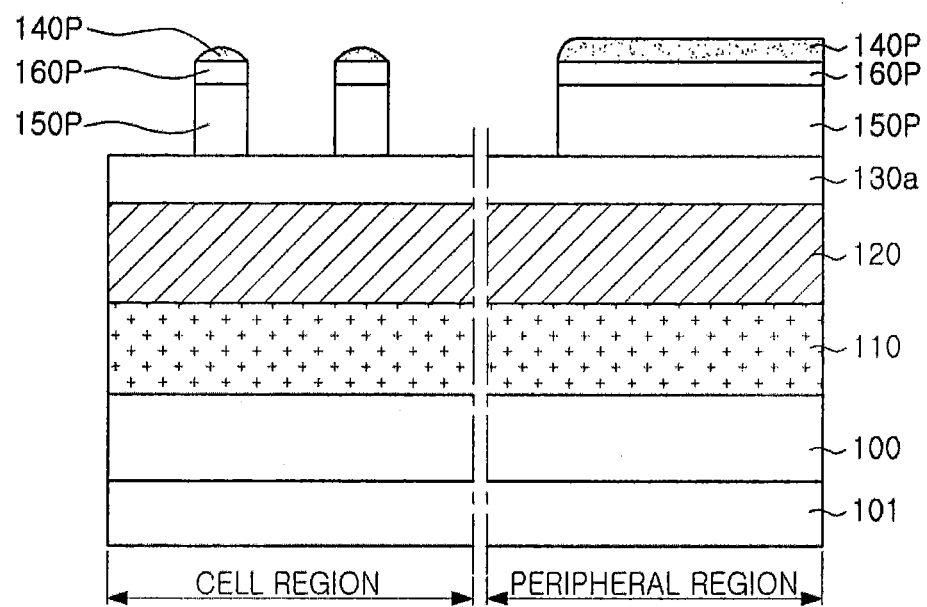

With reference to FIG. 5B, portions of the first and second sacrificial layers 150 and 160 and the cover layer 140 may be removed to form first and second sacrificial pattern layers 150P and 160P and a cover pattern layer 140P.

A photoresist layer may be formed and then patterned using a photolithography process. Then, an etching process of the first and second sacrificial layers 150 and 160 and the cover layer 140 may be performed using the patterned photoresist layer. During this etching process, an uppermost cover pattern layer 140P may be removed. Therefore, as illustrated in FIG. 5B, on relatively small first and second sacrificial pattern layers 150P and 160P of the cell region, a portion of the cover pattern layer 140P including a central portion may mainly remain.

Figure 5C:
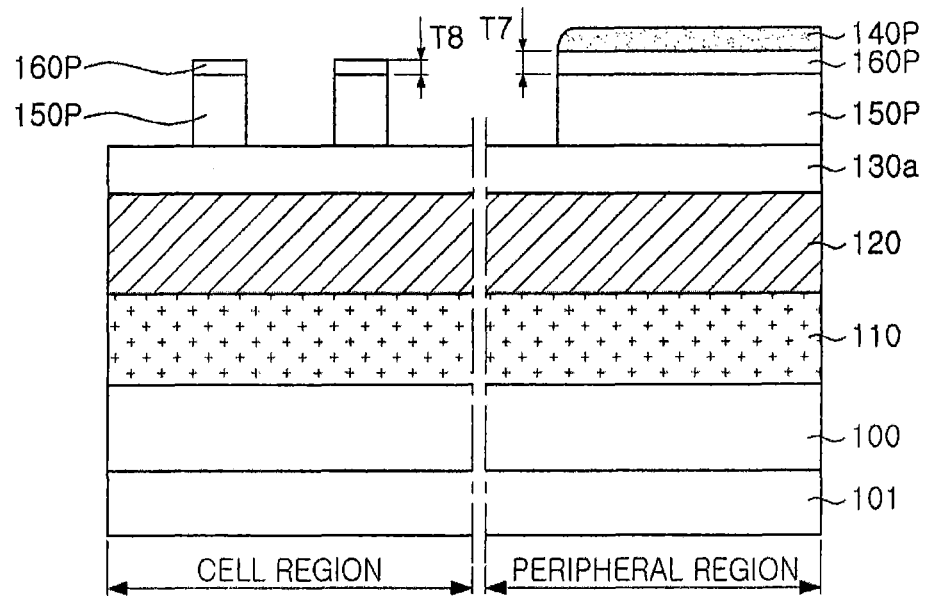

With reference to FIG. 5C, the cover pattern layer 140P may be removed from the cell region.

The cover pattern layer 140P may be removed from the cell region using a wet or dry etching process.

According to some embodiments of the present inventive concept, although a separate photoresist layer may be formed in the peripheral region, this process may also be performed without forming a separate photoresist layer, which may be determined in consideration of a difference in the size of the first and second sacrificial pattern layers 150P and 160P and the cover pattern layer 140P in the cell region and the peripheral region.

During the removal of the cover pattern layer 140P, a portion of the second sacrificial pattern layer 160P of the cell region may also be removed. For example, the second sacrificial pattern layer 160P of the cell region may have an eighth thickness T8 less than a seventh thickness T7 of the second sacrificial pattern layer 160P in the peripheral region. Thus, a step having a size, which corresponds to the sum of a difference between the seventh thickness T7 and the eighth thickness T8 and a thickness of the cover pattern layer 140P of the peripheral region, may be formed between the cell region and the peripheral region.

Figure 5D:
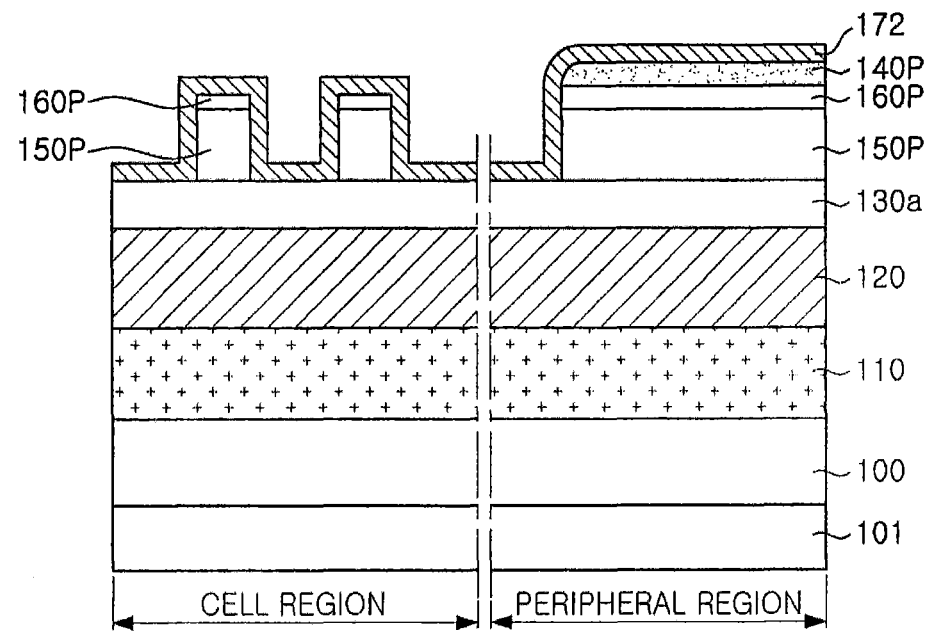

With reference to FIG. 5D, a first preparatory spacer layer 172 covering the first and second sacrificial pattern layers 150P and 160P and the cover pattern layer 140P may be formed.

The first preparatory spacer layer 172 may be formed using a material having an etch selectivity with respect to the first and second sacrificial pattern layers 150P and 160P.

Figure 5E:
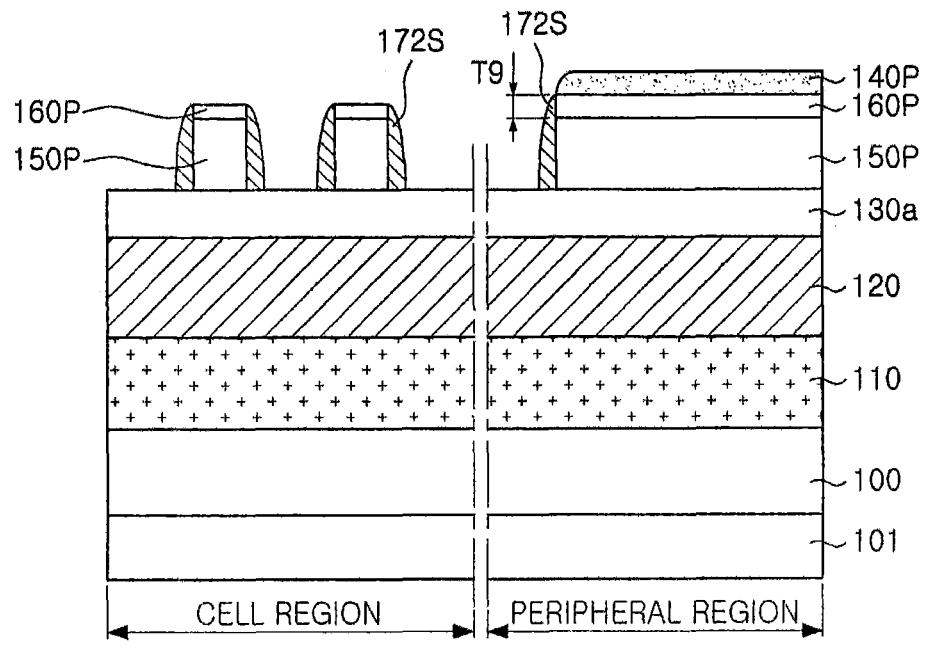

With reference to FIG. 5E, a first spacer layer 172S may be formed on sidewalls of the first and second sacrificial pattern layers 150P and 160P by etching the first preparatory spacer layer 172.

The first spacer layer 172S may be formed by etching the first preparatory spacer layer 172 until the second sacrificial pattern layer 160P and a third hard mask layer 130a between the first and second sacrificial pattern layers 150P and 160P are exposed.

A portion of the cover pattern layer 140P of the peripheral region may also be removed during etching the first preparatory spacer layer 172.

Figure 5F:
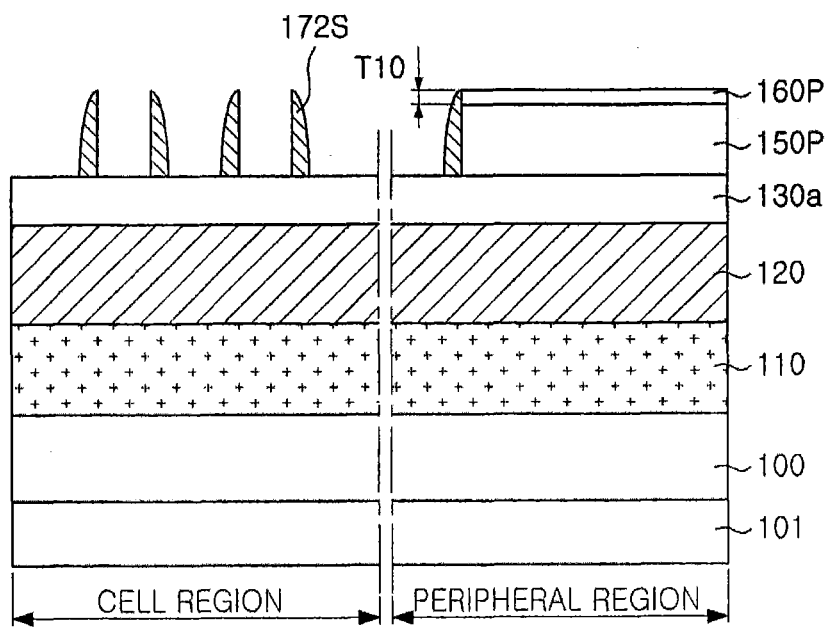

Referring to FIG. 5F, the first and second sacrificial pattern layers 150P and 160P may be removed from the cell region.

The first and second sacrificial pattern layers 150P and 160P may be selectively etched with respect to the first spacer layer 172S such that only the first and second sacrificial pattern layers 150P and 160P, which are disposed in the cell region, may be etched. However, as illustrated in FIG. 5F, the cover pattern layer 140P and an upper portion of the second sacrificial pattern layer 160P may also be removed from the peripheral region during the removal of the first and second sacrificial pattern layers 150P and 160P. Thus, the second sacrificial pattern layer 160P may have a tenth thickness T10 less than a ninth thickness T9 of FIG. 5E.

Subsequently, the processes described above with reference to FIG. 3G and FIGS. 3I through 3M may be performed to form the pattern 100P of FIG. 2.

Figure 6:
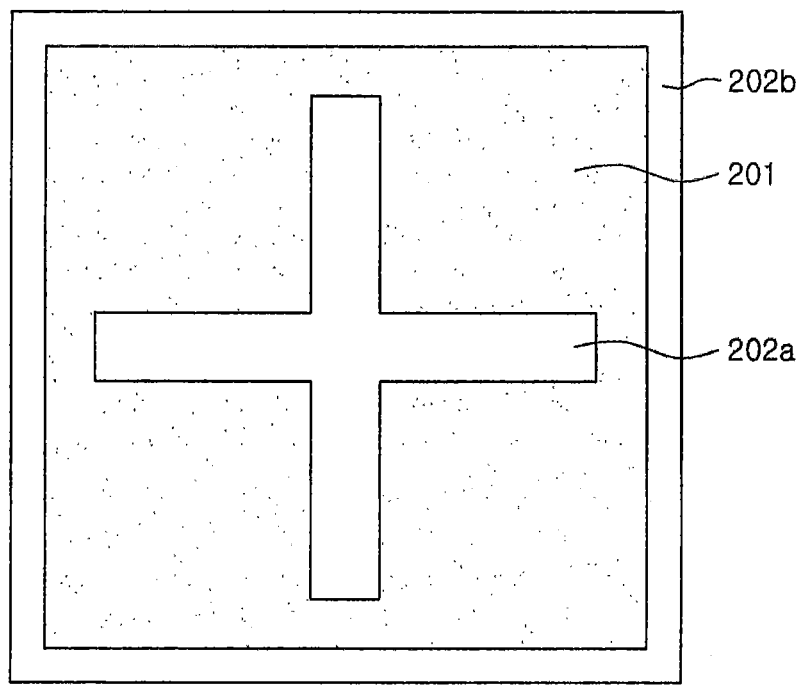
FIG. 6 is a plan view illustrating a key region of a semiconductor device formed using a method device according to some embodiments of the present inventive concept.

FIG. 6 is a plan view illustrating a key region of a semiconductor device formed using a method device according to some embodiments of the present inventive concept.

With reference to FIG. 6, a key region OL may be disposed in the scribe lane region SL of the semiconductor wafer 10 as illustrated in FIG. 2. The key region OL may include a substrate 201 as well as a trench key region 202a and an external trench key region 202b formed in the substrate 201.

The trench key region 202a and the external trench region 202b may be regions formed by removing a portion of the substrate 201 to be filled with, for example, an insulating material or the like. The trench key region 202a may function as an overlay key used in an exposure process of the semiconductor device.

A relatively large trench key region 202a may be formed in the key region OL included in the peripheral region while forming a fine pattern in the cell region, using the method of forming a pattern in a semiconductor device according to some embodiments of the present inventive concept described above with reference to FIGS. 3A through 3M. For example, the substrate 201 of FIG. 6 may correspond to the pattern 100P of FIG. 2 and FIG. 3M.

Figure 7:
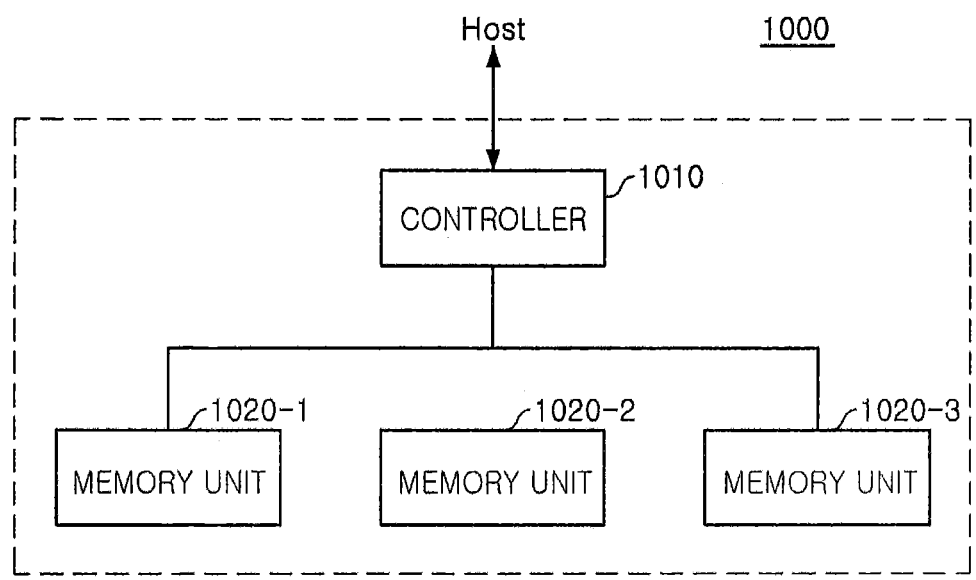
FIG. 7 is a block diagram of a storage device including a semiconductor device according to some embodiments of the present inventive concept.

FIG. 7 is a block diagram of a storage device including a semiconductor device according to some embodiments of the present inventive concept.

With reference to FIG. 7, a storage device 1000 according to some embodiments of the present inventive concept may include a controller 1010 communicating with a host and memory units 1020-1, 1020-2 and 1020-3 storing data therein. The respective memory units 1020-1, 1020-2 and 1020-3 may include a semiconductor device manufactured using a method according to some embodiments of the present inventive concept.

The host communicating with the controller 1010 may be provided as various electronic devices in which the storage device 1000 is mounted, and may be, for example, a smartphone, a digital camera, a desktop computer, a laptop computer, a portable media player, or the like. The controller 1010 may receive the request for writing or reading of data transferred by the host and may store the data in the memory units 1020-1, 1020-2 and 1020-3, or may generate a command CMD for drawing data out of the memory units 1020-1, 1020-2 and 1020-3.

As illustrated in FIG. 7, one or more memory units 1020-1, 1020-2 and 1020-3 may be connected to the controller 1010 to be parallel therewith within the storage device 1000. A relatively large capacity of storage device 1000 such as a solid state drive (SSD) may be implemented by connecting the plurality of memory units 1020-1, 1020-2 and 1020-3 to the controller 1010 in parallel.

Figure 8:
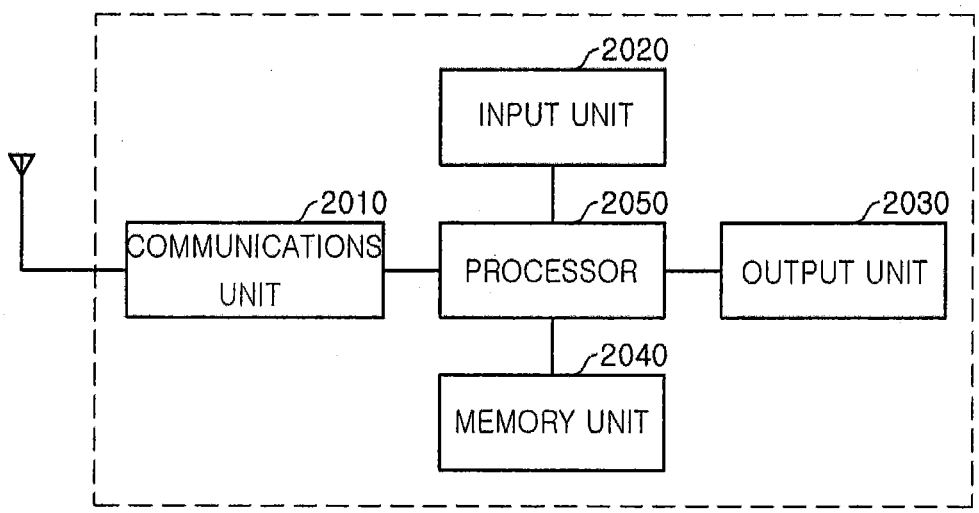
FIG. 8 is a block diagram of an electronic device including a semiconductor device according to some embodiments of the present inventive concept.

FIG. 8 is a block diagram of an electronic device including a semiconductor device according to some embodiments of the present inventive concept.

With reference to FIG. 8, an electronic device 2000 according to some embodiments of the present inventive concept may include a communications unit 2010, an input unit 2020, an output unit 2030, a memory unit 2040 and a processor 2050.

The communications unit 2010 may include a wire/wireless communications module, and may include a wireless internet module, a near field communications module, a global positioning system (GPS) module, a mobile communications module, or the like. The wire/wireless communications module included in the communications unit 2010 may be connected to an external communications network by various communications protocols to transmit and receive data.

The input unit 2020 may include a mechanical switch, a touch screen, a voice recognition module, or the like, provided as a module allowing a user to control an operation of the electronic device 2000. In addition, the input unit 2020 may also include a mouse operated using a track ball or laser pointer scheme, or the like, or may also include a finger mouse device. Further, the input unit 2020 may further include various sensor modules through which data is input by a user.

The output unit 2030 may output information processed by the electronic device 2000, in the form of voice or image, and the memory unit 2040 may store a program for processing and control of the processor 2050, data, or the like. The memory unit 2040 may include one or more semiconductor devices manufactured using the pattern forming method according to some embodiments of the present inventive concept, and the processor 2050 may transfer a command to the memory unit 2040 according to a necessary operation to thus store data or draw the data therefrom.

The memory unit 2040 may communicate with the processor 2050 through an interface embedded in the electronic device 2000 or through a separate interface. When the memory unit 2040 communicates with the processor 2050 through a separate interface, the processor 2050 may store data in or draw data out of the memory unit 2040 through various interface specifications such as SD, SDHC, SDXC, MICRO SD, USB, or the like.

The processor 2050 may control operations of respective parts included in the electronic device 2000. The processor 2050 may perform controlling and processing relevant to voice communications, video telephony, data communications, or the like, or relevant to multimedia reproduction and management. In addition, the processor 2050 may process an input by a user through the input unit 2020 and may output the processed results through the output unit 2030. Further, the processor 2050 may store data necessary for controlling an operation of the electronic device 2000 or may draw the data from the memory 2040.

Figure 9:
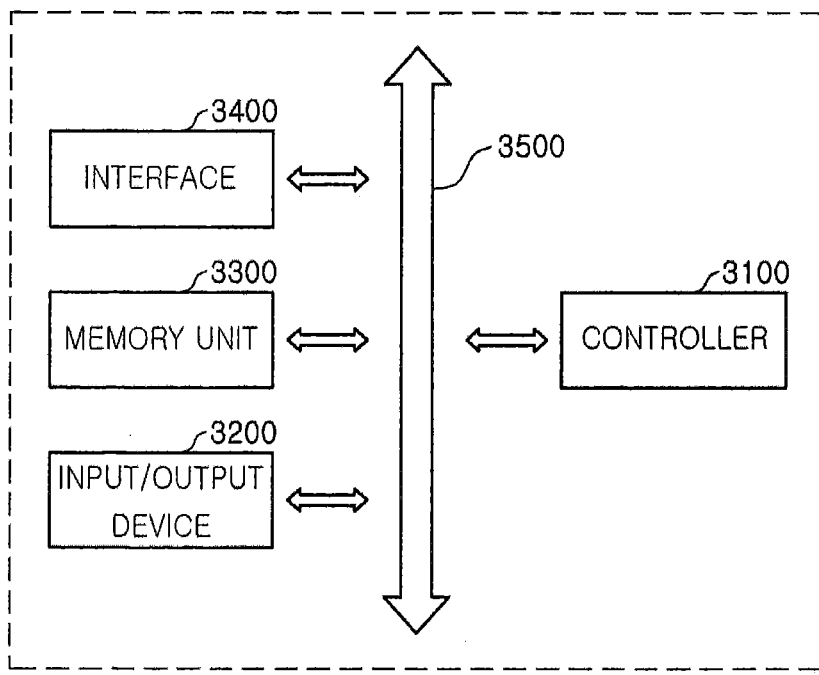
FIG. 9 is a schematic diagram of a system including a semiconductor device according to some embodiments of the present inventive concept.

FIG. 9 is a schematic diagram of a system including a semiconductor device according to some embodiments of the present inventive concept.

With reference to FIG. 9, a system 3000 may include a controller 3100, an input/output device 3200, a memory unit 3300, and an interface 3400. The system 3000 may be a mobile system or a system transmitting or receiving information. The mobile system may be a personal digital assistant (PDA), a portable computer, a tablet personal computer (PC), a wireless phone, a mobile phone, a digital music player, or a memory card.

The controller 3100 may serve to execute a program and control the system 3000. The controller 3100 may be a device such as a microprocessor, a digital signal processor, a microcontroller, or a device similar thereto.

The input/output device 3200 may be used to input or output data of the system 3000. The system 3000 may be connected to an external apparatus, for example, a personal computer or a network to communicate therewith so as to transfer data thereto and receive therefrom, using the input/output device 3200. The input/output device 3200 may be, for example, a keypad, a keyboard, or a display device.

The memory unit 3300 may store code and/or data for an operation of the controller 3100 therein, and/or may store data processed by the controller 3100. The memory unit 3300 may include a non-volatile memory according to some embodiments of the present inventive concept.

The interface 3400 may be a data transmission path between the system 3000 and an external different device. The controller 3100, the input/output device 3200, the memory unit 3300 and the interface 3400 may communicate with one another through a bus 3500.

At least one of the controller 3100 or the memory unit 3300 may include one or more semiconductor devices manufactured using a method according to some embodiments of the present inventive concept.

According to some embodiments of the present inventive concept, a method of forming a pattern in a semiconductor device in which various patterns having different pattern density or pattern sizes may be formed through a simplified process by selectively patterning a partial region in a process using a quadruple patterning technology (QPT) may be provided.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming a pattern in a semiconductor device, the method comprising:
sequentially forming a first hard mask layer and a second hard mask layer on an etching target layer comprising first and second regions;
sequentially forming a third hard mask layer and a first spacer layer on the second hard mask layer;
forming a third hard mask pattern layer by etching the third hard mask layer using the first spacer layer;
forming a second hard mask pattern layer by etching the second hard mask layer using at least a portion of the third hard mask pattern layer;
forming a second spacer layer on a sidewall of the second hard mask pattern layer;
forming a first hard mask pattern layer by etching the first hard mask layer using the second spacer layer; and
etching the etching target layer using the first hard mask pattern layer,
wherein the third hard mask pattern layer remaining on the second hard mask pattern layer has a first thickness in the first region and has a second thickness in the second region, and the first thickness is different from the second thickness.

2. The method of claim 1, wherein:
the first spacer layer comprises one among a plurality of first spacer layers; and
the method further comprises:
forming a sacrificial pattern layer; and
removing the sacrificial pattern layer between two of the plurality of first spacer layers in the first region such that the sacrificial pattern layer is disposed between two of the plurality of first spacer layers in the second region.

3. The method of claim 2, wherein forming the first spacer layer comprises:
forming a sacrificial layer on the second hard mask layer;
forming the sacrificial pattern layer by patterning the sacrificial layer;
forming a first preparatory spacer layer on the sacrificial pattern layer;
etching the first preparatory spacer layer to form the first spacer layer on a sidewall of the sacrificial pattern layer; and
removing the sacrificial pattern layer from the first region.

4. The method of claim 3, wherein:
etching the etching target layer comprises forming a pattern in the second region;
the pattern is formed in a region that corresponds to a region in which the sacrificial pattern layer is formed; and
the pattern has a size greater than a size of the sacrificial pattern layer.

5. The method of claim 3, wherein removing the sacrificial pattern layer comprises forming a photoresist layer in the second region.

6. The method of claim 2, wherein the first region comprises a cell region, and the second region comprises at least one of a peripheral circuit region and a scribe lane region.

7. The method of claim 6, wherein the second region comprises an overlay key region, and the overlay key region comprises a trench key.

8. The method of claim 1, wherein etching the etching target layer comprises forming a line pattern having a first width in the first region and forming a pattern, in the second region, having a second width that is greater than the first width.

9. The method of claim 1, wherein the third hard mask layer includes a first layer and a second layer sequentially stacked on the second hard mask layer, and
the third hard mask pattern layer includes a first pattern layer formed from the first layer and a second pattern layer formed from the second layer.

10. The method of claim 9, wherein a difference between the first thickness and the second thicknesses is substantially equal to or less than a thickness of the second layer.

11. The method of claim 9, further comprising removing the second pattern layer from the first region after forming the third hard mask pattern layer.

12. The method of claim 11, wherein the sacrificial pattern layer overlies the second pattern layer in the second region.

13. The method of claim 11, wherein removing the second pattern layer comprises selectively removing the second pattern layer using an etchant having an etch selectivity with respect to the first pattern layer.

14. The method of claim 11, wherein removing the second pattern layer from the first region is performed after forming the second hard mask pattern layer.

15. A method of forming a pattern in a semiconductor device, the method comprising:
sequentially forming a first hard mask layer, a second hard mask layer and a third hard mask layer on an etching target layer comprising first and second regions;
forming a sacrificial pattern layer on the third hard mask layer;
forming a first spacer layer on a sidewall of the sacrificial pattern layer;
removing the sacrificial pattern layer from the first region;
forming a third hard mask pattern layer by etching the third hard mask layer using the first spacer layer;
forming a second hard mask pattern layer by etching the second hard mask layer using the third hard mask pattern layer;
forming a second spacer layer on a sidewall of the second hard mask pattern layer;
forming a first hard mask pattern layer by etching the first hard mask layer using the second spacer layer; and
etching the etching target layer using the first hard mask pattern layer,
wherein the third hard mask pattern layer remaining on the second hard mask pattern layer has a first thickness in the first region and has a second thickness in the second region, and the first thickness is different from the second thickness.

16. The method of claim 15, further comprising:
forming a cover pattern layer on the sacrificial pattern layer; and
removing the cover pattern layer from the first region.

* * * * *